United States Patent
Manganaro

(10) Patent No.: US 7,202,744 B1
(45) Date of Patent: Apr. 10, 2007

(54) TRANSRESISTANCE AMPLIFIER

(75) Inventor: Gabriele Manganaro, Boxborough, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 114 days.

(21) Appl. No.: 11/153,939

(22) Filed: Jun. 15, 2005

(51) Int. Cl.
*H03F 3/04* (2006.01)

(52) U.S. Cl. ............... 330/296; 330/288; 341/153

(58) Field of Classification Search ............ 330/296, 330/288; 341/153
See application file for complete search history.

(56) References Cited

U.S. PATENT DOCUMENTS

| | | | | |
|---|---|---|---|---|
| 4,217,546 A | * | 8/1980 | Milkovic | 324/142 |
| 4,866,261 A | * | 9/1989 | Pace | 341/138 |
| 5,663,728 A | * | 9/1997 | Essenwanger | 341/153 |
| 5,923,216 A | * | 7/1999 | Pennock | 330/255 |
| 6,639,431 B1 | * | 10/2003 | Potter | 327/65 |
| 6,882,294 B2 | * | 4/2005 | Linder et al. | 341/154 |

* cited by examiner

*Primary Examiner*—Patricia Nguyen
(74) *Attorney, Agent, or Firm*—Patent Law Group LLP; Carmen C. Cook

(57) ABSTRACT

A transresistance amplifier circuit includes an input terminal receiving an input current, an output terminal providing an output voltage indicative of the input current, a first bias current source providing a first bias current to the input terminal, a first transistor, a second transistor, and a biasing circuit. The first transistor is coupled between the output terminal and the input terminal and controlled by a first bias voltage. The second transistor is coupled between a first supply voltage and the output terminal and controlled by a second bias voltage. The biasing circuit generates the first bias voltage for the first transistor for imposing a first voltage at the input terminal. The first voltage is equivalent to a selected voltage of an application circuit and the biasing circuit generates the first bias voltage in a manner so as to allow the first voltage to track variations in the selected voltage.

11 Claims, 4 Drawing Sheets

TRANSRESISTANCE AMPLIFIER

FIELD OF THE INVENTION

The invention relates to a transresistance amplifier, and in particular, to a transresistance amplifier operative to impose a predetermined voltage on the input terminal of the amplifier.

DESCRIPTION OF THE RELATED ART

Modern high speed digital-to-analog converter (DAC) architectures are often based on arrays of identical or properly sized current source cells. Each current source cell includes a current source whose output current is steered toward a negative or a positive output terminal depending on the digital data signal driving the current source cell. In an array of current source cells forming a digital-to-analog converter, a set of digital control bits drives the associated current source cells to steer the output current of each current source cell so as to produce the desired digital-to-analog converted result at the positive and negative output terminals. Such a digital-to-analog converter architecture is often referred to as a current steering digital-to-analog converter.

The linearity of the digital-to-analog conversion using such a current source array architecture relies on the relative matching of the individual current sources in each of the current source cells of the array. When the individual matching of the current sources cannot be guaranteed to the desired level of precision due to manufacturing inaccuracies, calibration or trimming techniques are applied to improve the precision of the current source. Calibration or trimming operation ensures the deviation of each source current from a reference value is reduced to a desired amount after the digital-to-analog converter devices have been fabricated.

A commonly used analog background calibration method for an array of current source cells uses a spare current source switchably connected to the current source cells to facilitate the calibration. The calibration method consists of periodically selecting individual current sources, steering their current away from the output terminals, and then adjusting their individual current to match a reference current within a desired accuracy. When a current source is selected to be calibrated, the spare current source, which may be previously calibrated, is steered to the output terminal to replace the current source being calibrated.

FIG. 1 is a circuit diagram of a conventional current steering DAC including a current source cell and a spare current source cell in a PMOS based implementation. Referring to FIG. 1, a current source cell 10 includes a current source providing a source current $I_T$ at a node 12. In the present illustration, the current source is implemented using PMOS transistors $M_{CS}$ and $M_M$. In the following description, transistor $M_{CS}$ will be referred to as the "current source device" while transistor $M_M$ will be referred to as the "memory device." Current source device $M_{CS}$ is biased by a DC voltage $V_{b1}$ to provide a certain amount of drain current to node 12. The gate and drain terminals of memory device $M_M$ are switchably connected a node A to also provide a certain amount of drain current to node 12. The source current $I_T$ is the sum of the drain currents of transistors $M_{CS}$ and $M_M$.

In operation, transistor $M_{CS}$ provides a base current value for source current $I_T$. Transistor $M_M$ is biased to provide a correction factor so that the total current value at node 12 is the desired source current $I_T$. In an array of current source cells, the base current value provided by the current source device $M_{CS}$ in each current source cell will vary due to device mismatches. Memory device $M_M$ is biased in a manner to provide just the sufficient amount of correction current so that the total source current $I_T$ at node 12 for each current source cell in the array is the same. Typically, current source device $M_{CS}$ provides about 70% of the total current $I_T$ while memory device $M_M$ provides the remaining 30%.

The current source of current source cell 10 also includes an output device. Most commonly, a cascode transistor $M_C$ is used as shown in FIG. 1. Cascode device $M_C$ provides the output source current $I_O$ to a current output node 14. In the configuration shown in FIG. 1, cascode transistor $M_C$ provides a DC output impedance magnification approximately equal to its intrinsic gain $g_{Mc}/g_{dsc}$, where $g_{Mc}$ is the transconductance of transistor $M_C$ and $g_{dsc}$ is the conductance looking into the drain terminal of transistor $M_C$. The cascode transistor thus realizes a magnification of the impedance looking into the current source.

In current source cell 10, the output source current $I_O$ is steered completely toward a positive output terminal O1 or a negative output terminal O2 by means of a source-coupled pair of transistors $M_{S1}$ and $M_{S2}$. The source-coupled pair of transistors $M_{S1}$ and $M_{S2}$ function as the current steering switches. The output source current $I_O$ is steered into the desired output terminal (O1 or O2) by control signals Q and its inverse Q\ driving the gate terminals of transistors $M_{S1}$ and $M_{S2}$. Control signals Q and Q\ are generated by control circuitry of the DAC (not shown) in response to digital data signals provided to the control circuitry. For a given digital data signal, only one of transistors $M_{S1}$ and $M_{S2}$ will be turned on to steer the output source current $I_O$ to the respective output terminal O1 or O2. In this manner, the digital data signal is converted to an analog current signal.

In an array of current source cells, the output terminals O1 of all the current source cells in the array are coupled together while the output terminals O2 of all the current source cells in the array are coupled together. Digital data signal driving each of the current source cells determining the total output current values for a positive output current at output terminal O1 and a negative output current at output terminal O2 for the array.

The basic calibration scheme for current source cell 10 is to program the gate-to-source voltage $V_{GS}$ of memory device $M_M$ to force the source current $I_T$ to be at the desired current level. The capacitance between the gate terminal and the source terminal of transistor $M_M$ will hold the programmed voltage but the programmed gate-to-source voltage will slowly discharge over time. The $V_{GS}$ voltage of memory device $M_M$ will then need to be periodically refreshed to maintain the total source current $I_T$ at the desired level. To implement the current source calibration, switches $S_1$, $S_2$, $S_3$, and $S_4$ are include in current cell 10. Specifically, switch $S_1$ is coupled to connect the gate terminal of memory device $M_M$ to node A while switch $S_3$ is coupled to connect the drain terminal of memory device $M_M$ to node A. Switch $S_2$ is coupled to connect the source current IT (node 12) to the source terminal (node 13) of cascode device $M_C$. Switch $S_4$ is coupled to connect the source terminal (node 13) of cascode device $M_C$ to a node C.

In order to perform background calibration of the current source cells, a so-called "spare current source" is used. In FIG. 1, a spare current source 18 is coupled to current source cell 10 to facilitate background calibration. Spare current source 18 basically duplicates the current source circuitry of current source cell 10. In other words, spare current source 18 has identical circuitry to that of current source cell 10 at and above switch $S_2$. Specifically, spare current source 18 includes transistor $M_{CS\_P}$ as the current source device and transistor $M_{M\_P}$ as the memory device. A source current $I_{T\_P}$ is provided at the common source node (node 12_P) of transistors $M_{CS\_P}$ and $M_{M\_P}$. Transistor $M_{CS\_P}$ is biased by voltage $V_{b1}$, the same voltage driving transistor $M_{CS}$ of current source cell 10. The gate and drain terminals of transistor $M_{M\_P}$ are switchably connected to a node A through switches $S_{1\_P}$ and $S_{3\_P}$. The source current $I_{T\_P}$ is provided to node C through switch $S_{2\_P}$.

FIG. 2 is a timing diagram illustrating the conditions of the switches for performing the calibration of the spare current source and the current source cell in the circuit of FIG. 1. First, the calibration of spare current source 18 is described. To calibrate spare current source 18, switches $S_{1\_P}$ and $S_{3\_P}$ are closed to connect the gate and drain terminals of memory device $M_{M\_P}$ to node A. Node A, which is common to spare current source 18 and current source cell 10, is coupled to a reference current $I_{REF}$. When switches $S_{1\_P}$ and $S_{3\_P}$ are closed, the reference current $I_{REF}$ is forced into node A so that source current $I_{T\_P}$ is forced to equal to current $I_{REF}$. Hence, the gate-to-source potential of memory device $M_{M\_P}$ settles to a voltage that ensures that current $I_{T\_P}$ is equal to current $I_{REF}$. At this time, switch $S_{2\_P}$ is open and switch $S_4$ is also open to isolate spare current source 18 from current source cell 10. Spare current source 18 is thus calibrated to set the desired source current value to eliminate variations in the current value due to device mismatches resulted from the fabrication process.

Meanwhile, current source cell 10 is operating in the active mode to provide a code dependent output value at output terminals O1 and O2 based on the state of the applicable digital data signal. In current source cell 10, switches $S_1$ and $S_3$ are open and switch $S_2$ is closed so that source current $I_T$ flows through switch $S_2$ (on) into the cascode device $M_C$. The output source current $I_O$ thus equals current $I_T$. Output source current $I_O$ is steered through transistor $M_{S1}$ or $M_{S2}$ depending on the value of Q and its inverse Q\. When the calibration of spare current source 18 is completed, switches $S_{1\_P}$ and $S_{3\_P}$ are open and the spare current source is ready for use.

The calibration of current source cell 10 is now described. To calibrate current source cell 10, switches $S_1$ and $S_3$ are closed and the reference current $I_{REF}$ coupled to node A is forced into the gate and drain terminals of memory device $M_M$. Source current $I_T$ is thus forced to current $I_{REF}$ and the gate-to-source voltage of memory device $M_M$ is thus programmed. While current source cell 10 is being calibrated, switch $S_2$ is open so that current source cell 10 does not provide a source current to the cascode device $M_C$. Instead, switches $S_{2\_P}$ and $S_4$ are closed to direct the previously calibrated current (current $I_{T\_P}$) at spare current source 18 to the cascode device $M_C$. In this manner, current source cell 10 can remain operational to the external circuitry where the output source current $I_O$ is steered through source-coupled pair of transistors $M_{S1}$, $M_{S2}$ toward one of the output terminals O1 and O2 depending on the value of the digital data signal. After current source cell 10 is calibrated, spare current source 18 can be disconnected from the current path of current source cell 10 by opening switches $S_{2\_P}$ and $S_4$. Current source cell 10 can then resume normal operation by closing switch $S_2$ and opening switches $S_1$ and $S_3$.

During actual operation of the current source array, because of environmental variations (e.g., temperature and supply voltage) and non-ideal effects associated with the current source architecture (e.g., charge leakage on the current source devices and the memory devices), the programmed gate-to-source voltage $V_{GS}$ of the memory devices will drift over time and the corresponding source current values will deviate from the desired value. Thus, current source cell 10 and spare current source 18 need to be periodically calibrated or "refreshed" before the source current sensibly deviates from the desired value and accuracy. Thus, by periodically alternating the spare current source calibration and the current source cell calibration, source currents $I_{T\_P}$ and $I_T$ are matched to the desired reference current $I_{REF}$. Meanwhile, a calibrated output source current $I_O$ is simultaneously made available for code dependent steering toward the desired output terminal. The calibration process described above can be extended to an array of K current source cells using a single spare current source or multiple spare current sources.

The implementation of the conventional calibration scheme described above has many limitations and disadvantages. The limitations and disadvantages are significantly exacerbated when either one of current source devices and memory devices ($M_{CS}/M_M$ or $M_{CS\_P}/M_{M\_P}$) is implemented using a sub-micron MOS device or when the current source array is operated under low power supply conditions, such as a power supply voltage $V_{dd}$ of 3.3 volts or less. As CMOS process technology evolves, smaller feature sizes and lower supply voltages challenge established analog design techniques. Specifically, sub-micron MOS transistors have such short channel lengths that the small signal drain-to-source conductance $g_{ds}$ is significantly higher and quiescent-point-sensitive than their longer channel counterparts. Moreover, lower supply voltages put serious constraints on the ability to properly bias the stacks of transistors which commonly implement analog current sources in high performance systems such as current steering digital to analog converters (DACs).

Basically, the conventional calibration scheme calibrates the source current ($I_T$ or $I_{T\_P}$) of the current sources without regard to the actual operating conditions of the current sources. In normal operation, the output voltage of the current source cell may appear at the current source output device (the cascode device $M_C$), introducing variations to the source current not accounted for by the calibration. Specifically, when current source cell 10 is being operated, one of the current steering switches $M_{S1}$ and $M_{S2}$ in the current source cell is turned on and the output voltage at either terminal O1 or terminal O2 will appear with some attenuation at current output node 14. The output voltage will also appear with additional attenuation at the source terminal (node 13) of cascode device $M_C$. When the output voltage is impressed at the source terminal (node 13) of transistor $M_C$, the voltage at the source terminal of transistor $M_C$ will disturb the drain voltage (node 12) of the current source device $M_{CS}$ and the memory device $M_M$, thereby causing variations in the source current $I_T$. The perturbation of the drain voltage of the current source device and the memory device results in nonlinearity of the current source array as the source current $I_T$ now varies in accordance with the output voltage value of the current source array.

A close inspection of the circuit of FIG. 1 will reveal that the same source current perturbation occurs when the spare current source is used to substitute for current source cell 10 while the current source cell is being calibrated. Source current $I_{T\_P}$ will be caused to deviate from its calibrated value due to the output voltage being impressed on the source terminal (node 13) of cascode device $M_C$.

More specifically, when the current source devices (transistor $M_{CS}$ or $M_{CS\_P}$) and/or the memory devices (transistor $M_M$ or $M_{M\_P}$) of the current source array are implemented as sub-micron MOS transistors having short channel lengths, the small signal drain-to-source conductance $g_{ds}$ of the transistors becomes relatively large and very sensitive to the transistor's quiescent point. Consequently, after calibration is completed and the current source is coupled for use in normal operation, source current $I_T$ (or $I_{T\_P}$) will vary when the drain potential (node 12 or 12_P) of transistors $M_{CS}$ and $M_M$ (or transistors $M_{CS\_P}$ and $M_{M\_P}$) changes from the calibrated value of:

$$V_D = V_{dd} - V_{SG\_MM}, \text{ when } S_1, S_3 = \text{on and } I_T = I_{REF},$$

to the output-voltage-driven value of:

$$V_D = V_{b2} + V_{SG\_MC}, \text{ when } S_1, S_3 = \text{off and } I_T = I_O,$$

where $V_{SG\_MM}$ is the source-to-gate voltage of the memory device ($M_M$ or $M_{M\_P}$) and $V_{SG\_MC}$ is the source-to-gate voltage of the cascode device $M_C$.

The change in the drain voltage at node 12 (or 12_P) introduces an error current $I\epsilon = I_{REF} - I_O$ to the calibrated current value of source current $I_T$. The error current is the difference between the reference current $I_{REF}$ and the output source current $I_O$ flowing through current steering switches $M_{S1}$ and $M_{S2}$ due to one of the current steering switches being turned on.

If transistor pair $M_M/M_{CS}$ and transistor pair $M_{M\_P}/M_{CS\_P}$ were identical, then the same error current $I\epsilon$ would be equally different from the reference current $I_{REF}$ and the source current $I_T$ will still mutually matched each other, which is the ultimate goal of the calibration process. However, in actual implementations, transistors pairs $M_M/M_{CS}$ and $M_{M\_P}/M_{CS\_P}$ are not identical. Therefore, different $I\epsilon$ current errors would be introduced in each current source despite the fact that the cascode device $M_C$ is shared.

The output-voltage induced current mismatch degrades the calibration accuracy, especially for short channel length transistors. Such degradation becomes particularly severe if, due to low power supply voltage constraints, cascode device $M_C$ is biased such that the voltage at the source terminal (node 13) of cascode device $M_C$ is greater than the calibrated drain potential (node 12) of the current source device $M_{CS}$ and the memory device $M_M$. That is, when $$V_{b2} + V_{SG\_MC} > V_{dd} - V_{SG\_MM},$$

the source voltage of cascode device $M_C$ forces the shared drain voltage of transistors $M_M/M_{CS}$ higher than the voltage $V_{b1}$ driving transistor $M_{CS}$ and closer to transistor $M_{CS}$'s transition from saturation to the triode state. In this condition, the small signal drain-to-source conductance $g_{ds}$ increases very rapidly and the overall current source performance is affected.

In view of the above limitations and disadvantages, it is therefore desirable to provide a calibration scheme for a current source cell array which overcomes the aforementioned limitations and disadvantages of the conventional calibration scheme.

SUMMARY OF THE INVENTION

According to one embodiment of the present invention, a calibration circuit for a current source cell includes a reference current source and a transresistance amplifier forming a calibration feedback loop for calibrating the output current of the current source cell. The current source cell includes a current source providing a first current to a current output node as the output current. The current source has a calibration voltage node for receiving a bias voltage that drives the current source to provide the first current having a substantially constant value. The reference current source supplies a reference current to a first node where the first node is switchably connected to the current output node. The transresistance amplifier has an input terminal coupled to the first node for receiving an input current and an output terminal switchably connected to the calibration voltage node. The output terminal of the transresistance amplifier provides an output voltage indicative of the input current. When the first node is connected to the current output node and the output terminal of the transresistance amplifier is connected to the calibration voltage node, an input current develops at the first node having a value equal to the difference between the first current and the reference current. The transresistance amplifier receives the input current and generates an output voltage in response to the input current for driving the calibration voltage node, the output voltage having a value operative to nullify the difference between the first current and the reference current, thereby calibrating the current source cell.

According to another embodiment of the present invention, a current source array includes one or more current source cells where at least one of the current source cells is a spare current source cell ("spare cell"). Each of the one or more current source cells includes a current source providing a first current to a current output node. The current source has a calibration voltage node for receiving a bias voltage that drives the current source to provide the first current having a substantially constant value. Each current source cell further includes a first switch coupled between the current output node and a first output terminal and having a control terminal driven by a first control signal and a second switch coupled between the first node and a second output terminal and having a control terminal driven by a second control signal. The first and second control signals have a turn-on voltage level for closing the respective first and second switches.

The current source array further includes a calibration circuit for calibrating the one or more current source cells. The calibration circuit includes a reference current source supplying a reference current to a first node where the first node is switchably connected to the current output node of each current source cell, and a transresistance amplifier having an input terminal coupled to the first node for receiving an input current and an output terminal switchably connected to the calibration voltage node of each current source cell. The output terminal of the transresistance amplifier provides an output voltage indicative of the input current.

In operation, the first node is connected to a current output node and the output terminal of the transresistance amplifier is connected to a calibration voltage node of one of the current source cells to calibrate the current source cell. An input current develops at the first node having a value equal to the difference between the first current and the reference current. The transresistance amplifier receives the input current and generates an output voltage in response to the input current for driving the calibration voltage node of the current source cell under calibration, the output voltage having a value operative to nullify the difference between the first current and the reference current, thereby calibrating the current source cell.

The current source array further includes a first array output terminal connecting the first output terminals of the one or more current source cells together to provide a first output current, and a second array output terminal connecting the second output terminals of the one or more current source cells together to provide a second output current. Each of the one or more current source cells is calibrated in turn to maintain the first current of each current source cell at a substantially constant value. The current source cell being calibrated is disabled and the spare cell is activated to substitute for the current source cell being calibrated.

A method for calibrating a current source cell includes providing a first current at a current output node where the first current is capable of being calibrated by receiving a bias voltage at a calibration voltage node and the bias voltage is applied to maintain the first current at a substantially constant value, steering the first current to a selected one of first and second current paths in accordance with a data signal where the first current path is controlled by a first control signal and the second current path is controlled by a second control signal, disabling the first and second current paths, coupling a calibration circuit including a transresistance amplifier and a reference current source to the current output node and the calibration voltage node to form a feedback loop. The reference current source supplies a reference current to the current output node and the transresistance amplifier has an input terminal coupled to the current output node and an output terminal coupled to the calibration voltage node. The method further includes developing a current at the current output node having a value equal to the difference between the first current and the reference current, receiving at the input terminal of the transresistance amplifier the input current, and generating at the output terminal of the transresistance amplifier an output voltage in response to the input current for driving the calibration voltage node where the output voltage has a value operative to nullify the difference between the first current and the reference current, thereby calibrating the current source cell.

According to another aspect of the present invention, a transresistance amplifier circuit includes an input terminal receiving an input current, an output terminal providing an output voltage indicative of the input current, a first bias current source providing a first bias current to the input terminal, a first transistor, a second transistor, and a biasing circuit. The first transistor has a first current handling terminal coupled to the output terminal, a second current handling terminal coupled to the input terminal, and a control terminal receiving a first bias voltage. The second transistor has a first current handling terminal coupled to a first supply voltage, a second current handling terminal coupled to the output terminal, and a control terminal receiving a second bias voltage. The biasing circuit generates the first bias voltage for the first transistor where the first bias voltage is generated to drive the first transistor for imposing a first voltage at the input terminal. The first voltage is equivalent to a selected voltage of an application circuit to which the transresistance amplifier is to be coupled and the biasing circuit generates the first bias voltage in a manner so as to allow the first voltage to track variations in the selected voltage.

The present invention is better understood upon consideration of the detailed description below and the accompanying drawings.

DETAILED DESCRIPTION OF THE PREFERRED EMBODIMENTS

Figure 1:
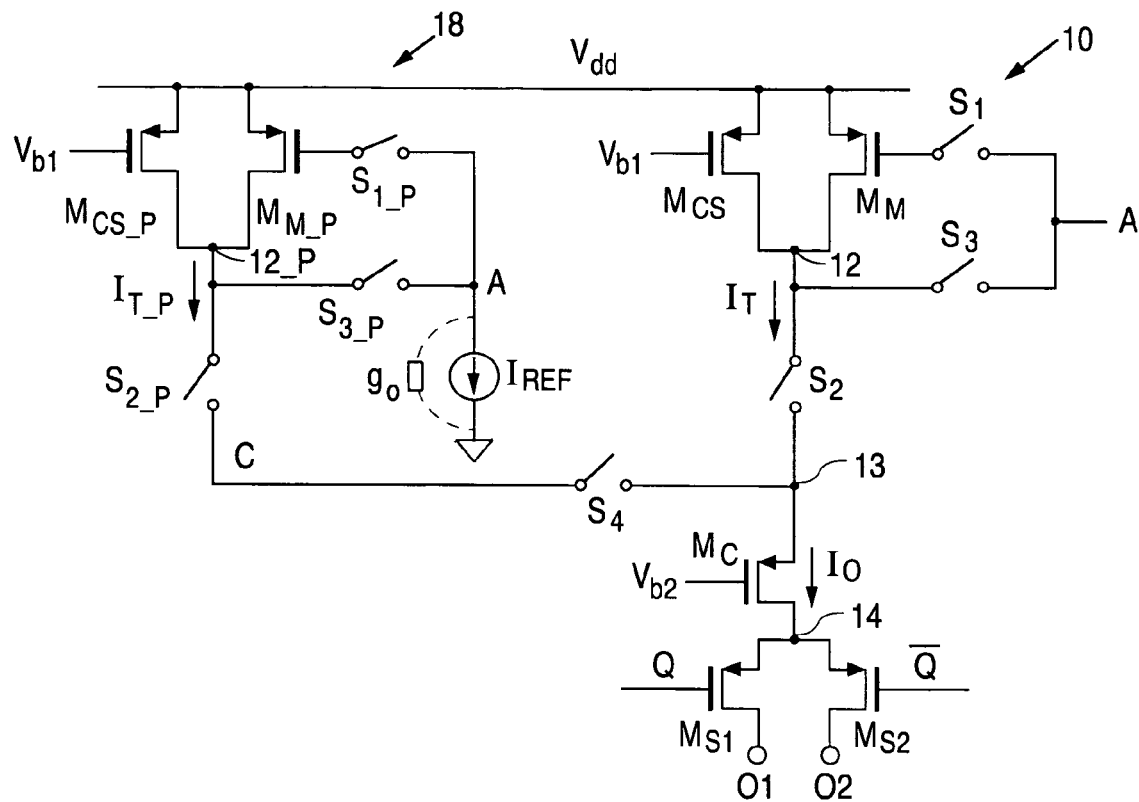
FIG. 1 is a circuit diagram of a conventional current steering DAC including a current source cell and a spare current source cell in a PMOS based implementation.
Figure 2:
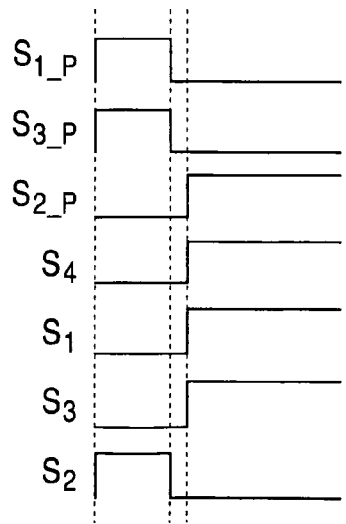
FIG. 2 is a timing diagram illustrating the conditions of the switches for performing the calibration of the spare current source and the current source cell in the circuit of FIG. 1.

In accordance with the principles of the present invention, a calibration scheme for an array of current source cells uses a feedback loop to calibrate the combination of the current generating devices and the corresponding output device of each current source cell. In this manner, calibration is applied to the entire stack of transistor devices within each current source cell to account for all sources of current errors in the current source cell. The output current of each current source cell is thus calibrated to the desired value in view of the actual operating conditions of the current source cell. The output current of the current source cell, once calibrated, can maintain its accuracy when the current source cell is placed back in normal operation after calibration is completed. In accordance with the present invention, the calibration feedback loop is implemented using a transresistance amplifier where the transresistance amplifier operates to magnify the calibration accuracy and to introduce a necessary level shift function to allow maximum design freedom on the current source design.

In one embodiment, a current source cell in a current source array includes a parallel combination of a current source device and a memory device (transistors $M_{CS}$ and $M_M$) as the current generating devices and a cascode transistor MC as the corresponding output device. The calibration feedback loop is applied to calibrate the entire stack of devices including current source device $M_{CS}$, memory device $M_M$ and cascode transistor $M_C$ connected in series with the current source/memory devices. By incorporating cascode transistor $M_C$ in the calibration, the final output current of the current source cell, that is, the output source current $I_O$ of cascode transistor $M_C$, is calibrated to the desired value and the accuracy of the calibrated current is not lost when the current source cell is applied for use in the active mode. In the conventional calibration method, calibration is applied only to the current generating devices and the accuracy of the calibration is often lost when current generating devices are coupled to the output device of the current source cell when the current source cell is put back in the active mode after calibration. The loss of calibration accuracy is due to output voltage conditions experienced by the output device causing the biasing voltage of the current source to change.

According to one aspect of the present invention, the spare current source cell ("spare cell") in the current source array is configured identical to the current source cells and operates to substitute the current generating as well as the current steering operations of a current source cell under calibration. In this manner, the calibration scheme of the present invention can be applied to the spare current source cell in the same manner to ensure that the entire stack of devices in the spare current source cell is calibrated for improved accuracy. When the spare cell is substituted for a current source cell under calibration, the output source current provided by the spare cell has been fully calibrated by taking into account the output device of the spare cell. In the conventional calibration scheme, the spare cell consists only of a spare current source and calibration is applied only to the current generating devices of the spare current source without taking into consideration the output device that is in the current path of the output current supplied by the spare current source.

A main advantage of the calibration scheme of the present invention is that calibration is applied to the entire stack of transistors in each current source cell so that the calibration takes into account the actual operating conditions of the current source cell. In actual operation, an output device is included in the current path of the output source current in each current source cell. By calibrating the entire stack of transistors in the current source cell, the calibrated source current will have improved accuracy where the calibrated current value does not deviate from the desired value when the current source cell is operated in the active mode. When the array of current source cells including the spare current source cell is configured to form a current steering digital-to-analog converter, background calibration of the current source cells can be performed without degrading the performance of the digital-to-analog converter.

Figure 3:
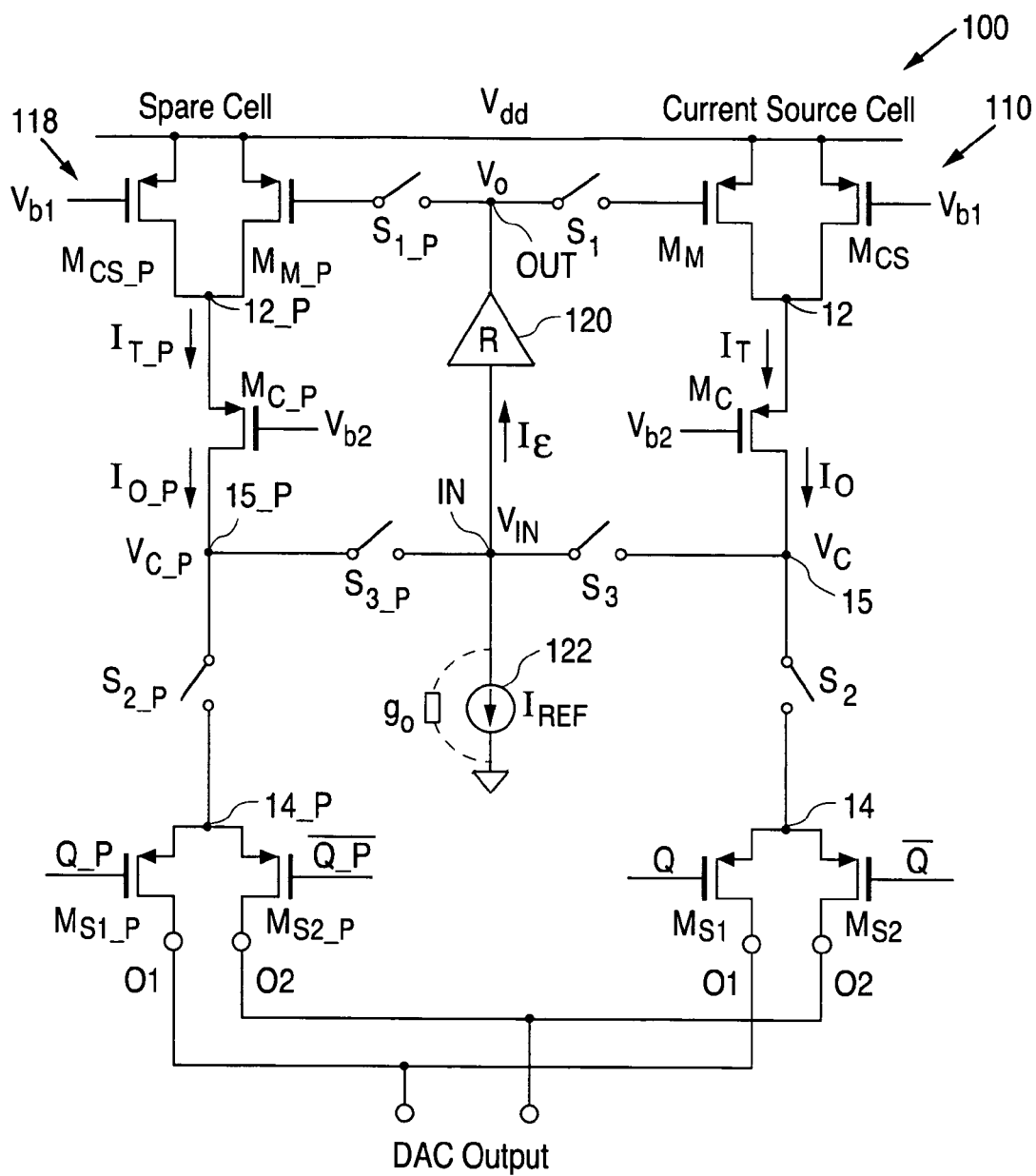
FIG. 3 is a circuit diagram of a current source array including a current source cell and a spare current source cell implementing the calibration scheme according to one embodiment of the present invention.

FIG. 3 is a circuit diagram of a current source array including a current source cell and a spare current source cell implementing the calibration scheme according to one embodiment of the present invention. In accordance with the calibration scheme of the present invention, a spare current source cell ("spare cell") 118 having identical construction to current source cell 110 is incorporated in the array 100 of current source cells to realize background calibration. Thus, the spare current source cell 118 includes the current source, the output device and the current steering switches. Therefore, in an array of current source cells, the spare current source cell is merely one instance of the current source cells in the array. The calibration scheme of the present invention uses an entire current source cell as the spare cell, instead of merely providing a spare current source to perform the current generating function. By implementing a full current source cell as the spare cell, the calibration scheme of the present invention ensures that the spare cell is calibrated by the calibration feedback loop to the same level of accuracy as all other current source cells in the array.

Because of the identical construction, in the following description, references to the "current source cell" and description thereof will apply to both the current source cell 110 and the spare cell 118. In the present illustration, current source array 100 includes a single current source cell 110 and a single spare cell 118. In actual implementations, current source array 100 can include multiple current source cells and one or more spare current source cells to realize a current steering digital-to-analog converter. Thus, current source cell 110 in FIG. 3 is representative of any one current source cell in an array of current source cells.

In the embodiment shown in FIG. 3, the current source cell (cells 110 and 118) is constructed in a PMOS based implementation. One of ordinary skill in the art, upon being apprised of the present invention, would appreciate that the current source cell can also be implemented using NMOS transistors, or NPN bipolar transistors or PNP bipolar transistors. The voltage polarities of the current source cell can be accordingly modified when NMOS transistors or NPN bipolar transistors are used. The current source cell of FIG. 3 is constructed in a similar manner as the current source cell of FIG. 1 and like elements are given like reference numerals to simplify the discussion.

Referring to FIG. 3, current source cell 110 includes a current source providing a source current $I_T$ at a node 12. In the present embodiment, the current source is implemented using a PMOS transistor $M_{CS}$ as the current source device and a PMOS transistor $M_M$ as the memory device. Current source device $M_{CS}$ is biased by a DC voltage $V_{b1}$ to provide a drain current having a first value to node 12. The gate-to-source voltage of memory device $M_M$ is programmed by the calibration feedback loop of the present invention to provide a drain current having a second value to node 12. The source current $I_T$ is the sum of the drain currents of transistors $M_{CS}$ and $M_M$. In the present description, transistors $M_{CS}$ and $M_M$ forming the current source of the current source cell are sometimes referred to as current generating devices.

In operation, transistor $M_{CS}$, bias by voltage $V_{b1}$, provides a base current value for source current $I_T$. Transistor $M_M$ is biased with a programmed gate-to-source voltage to provide a correction factor so that the total current value at node 12 is the desired source current $I_T$. As described above, in an array of current source cells, the base current value provided by the current source device $M_{CS}$ in each current source cell will vary due to device mismatches. Memory device $M_M$ is biased in a manner to provide just the sufficient amount of correction current so that the total source current $I_T$ at node 12 for each current source cell in the array is the same. Typically, current source device $M_{CS}$ provides about 70% of the total current $I_T$ while memory device $M_M$ provides the remaining 30%.

In the present embodiment, current source cell 110 further includes an output device connected directly to the drain terminals of transistors $M_{CS}$ and $M_M$. That is, the output device is connected to the common drain terminal (node 12) of the current source device and the memory device of the current source without any intervening switches. In the present embodiment, the output device is a cascode transistor $M_C$ having a source terminal connected directly to node 12 for receiving the source current $I_T$. Cascode device $M_C$ is biased by a gate voltage Vb2 to provide an output source current $I_O$ to a current output node 15. Cascode transistor $M_C$ operates to provide a DC output impedance magnification of the current source as described above.

In the present embodiment, the output source current $I_O$ of cascode device $M_C$ is coupled through a switch $S_2$ to the common source node 14 of current steering transistors $M_{S1}$ and $M_{S2}$. When switch $S_2$ is closed, current $I_O$ is steered to one of the output terminals O1 and O2 by current steering transistors $M_{S1}$ and $M_{S2}$. In the present embodiment, switch $S_2$ is open to disable the current source cell when the current source cell is being calibrated. Specifically, the switch $S_{2\_P}$ of the spare cell is closed to allow the spare cell to take the place of the current source cell being calibrated. Switch $S_2$ in each current source cell is an optional element. Depending on the control schemes of current steering transistors $M_{S1}$ and $M_{S2}$, switch $S_2$ may be omitted in other embodiments of the current source cell and the drain terminal of cascode device $M_C$ (node 15) can be connected directly to common source node 14 without intervening switches, as will be explained in more detail below.

In an array of current source cells, the output terminals O1 of all the current source cells in the array are coupled together while the output terminals O2 of all the current source cells in the array are coupled together. A digital data signal drives each of the current source cells and determines the total output current values for a positive output current at output terminal O1 and a negative output current at output terminal O2 for the array. In the present embodiment, the output terminals O1 and O2 for spare cell 118 are also connected to the respective output terminals O1 and O2 for all other current source cells. When spare cell 118 is activated to replace one of the current source cells in the array, the current steering transistors $M_{S1\_P}$ and $M_{S2\_P}$ of spare cell 118 operate in the same manner as the replaced current source cell to steer the output source current $I_{O\_P}$ to the respective output terminals O1 and O2.

In current source cell 110, the current source including current generating devices $M_{CS}$ and $M_M$ and the output device including cascode device $M_C$ form the entire stack of transistor devices in the current source cell for generating an output source current $I_O$ at current output node 15. The calibration scheme of the present invention is applied to calibrate the entire stack of transistor devices to ensure that source current $I_T$ generated by the current source has the desired value. The calibration scheme is implemented by forming a calibration feedback loop between the gate terminal of memory device $M_M$ and the current output node 15 of cascode device $M_C$ so that the gate-to-source voltage $V_{GS}$ of memory device $M_M$ is programmed to a value for providing a source current $I_T$, and also output current $I_O$, having the desired current value.

In accordance with the present invention, the calibration scheme is implemented by a calibration circuit including a transresistance amplifier 120 and a reference current source 122 providing a reference current $I_{REF}$. Transresistance amplifier 120 has an input terminal (node IN) receiving an input current Iε and an output terminal (node OUT) providing an output voltage $V_O$. Transresistance amplifiers are well known in the art. A transresistance amplifier receives an input current and generates an output voltage indicative of the value of the input current. In the calibration circuit of the present invention, transresistance amplifier 120 provides an output voltage $V_O$ at the OUT node where the output voltage $V_O$ has a nominal base value established internally (such as by a bias current $I_{BIAS}$) and a voltage variation about the nominal base value indicative of an input current Iε at the IN node. Reference current source 122 is coupled between IN node and the ground node. Reference current $I_{REF}$ represents the desired current value for the current source cells of array 100. Thus, when calibration is applied, source current $I_T$ of each current source cell is calibrated to the current value of reference current $I_{REF}$.

The calibration circuit of transresistance amplifier 120 and current source 122 is switchably connected to the gate terminal of memory device $M_M$ and to current output node 15 of each current source cell, including the spare cell, to form the calibration feedback loop. With respect to current source cell 110, a switch $S_1$ connects the output node OUT of transresistance amplifier 120 to the gate terminal of memory device $M_M$ and a switch $S_3$ connects the input node IN of transresistance amplifier 120 to current output node 15. When current source cell 110 is to be calibrated, switches $S_1$ and $S_3$ are closed while switch $S_2$ is open to complete the calibration feedback loop and calibration of current source cell 110 can then be carried out. Similarly for spare cell 118, the calibration circuit is switchably connected to the gate terminal of memory device $M_{M\_P}$ through switch $S_{1\_P}$ and to current output node 15_P through a switch $S_{3\_P}$. When spare cell 18 is to be calibrated, switches $S_{1\_P}$ and $S_{3\_P}$ are closed while switch $S_{2\_P}$ is open to coupled the calibration circuit to the spare cell and calibration of the spare cell can then be carried out.

In an array of multiple current source cells, the calibration circuit is coupled in turn through switches $S_1$ and $S_3$ of each current source cell to perform the calibration. Thus, in an array of current source cells, only one calibration circuit is needed for sequentially calibrating all the current source cells, including the spare cell, in the array.

The goal of the calibration for the current source cell is to program the gate-to-source voltage $V_{GS}$ of memory device $M_M$ to force the source current $I_T$ to equal to reference current $I_{REF}$. After calibration is completed, switches $S_1$ and $S_3$ are open and the capacitance between the gate terminal and the source terminal of transistor $M_M$ will hold the programmed voltage. The programmed gate-to-source voltage will slowly discharge over time and the $V_{GS}$ voltage of memory device $M_M$ will then need to be periodically refreshed to maintain the total source current $I_T$ at the desired $I_{REF}$ level. In an array of current source cells, calibration is performed sequentially for each current source cell and is repeated in a periodic manner to refresh the programmed gate-to-source voltage of memory device $M_M$.

Figure 4:
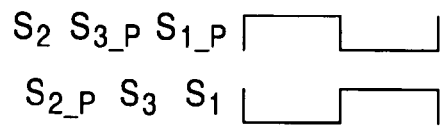
FIG. 4 is a timing diagram illustrating the conditions of the switches for performing the calibration of the spare current source cell and the current source cell in the array of FIG. 3 according to one embodiment of the present invention.

The operation of the calibration circuit to implement the calibration scheme of the present invention will now be described with reference to the timing diagram in FIG. 4. First, switches $S_2$, $S_{1\_P}$ and $S_{3\_P}$ are closed while switches $S_{2\_P}$, $S_1$ and $S_3$ are open. Thus, current source cell 110 is in active mode for normal operation while spare cell 118 is being calibrated. With switch $S_{2\_P}$ being open, spare cell 118 does not supply current to the current steering switches $M_{S1\_P}$ and $M_{S2\_P}$. Instead, the entire stack of devices, including transistors $M_{CS\_P}$, $M_{M\_P}$ and $M_{C\_P}$, is calibrated by the calibration feedback loop.

At spare cell 118, a current $I_{T\_P}$ resulting from the drain current contribution of current source device $M_{CS\_P}$, biased by voltage $V_{b1}$, and memory device $M_{M\_P}$, biased by a programmed gate-to-source voltage held by its gate-to-source capacitance. Current $I_{T\_P}$ flows through cascode transistor $M_{C\_P}$ to current output node 15_P as output source current $I_{O\_P}$. When the calibration circuit is coupled to spare cell 118 through switches $S_{1\_P}$ and $S_{3\_P}$, current $I_{T\_P}$ (which equals current $I_{O\_P}$) flows through switch $S_{3\_P}$ to the IN node of transresistance amplifier 120. Current $I_{T\_P}$ is summed with other currents converging at node IN. Specifically, current $I_{T\_P}$ is summed with reference current $I_{REF}$ flowing out of node IN. Thus, an error current Iε results at node IN and is given as:

$$I\epsilon = I_{T\_P} - I_{REF} - V_{IN}*g_O,$$

where $V_{IN}$ is the voltage at the IN node and $g_O$ is the small signal output conductance of reference current source 122. Reference current source 122 providing reference current $I_{REF}$ has an associated output impedance, represented by small signal output conductance $g_O$. The output conductance of reference current source 122 draws a certain amount of current from the output node of the current source. Depending on the load impedance, the output current provided reference current source 122 may include a current component drawn by the small signal output conductance $g_O$. For the purpose of the present discussion, the current drawn by the small signal output conductance of reference current source 122 is assumed to be very small (that is, assume $V_{IN}g_O << I\epsilon$) and is therefore negligible. The contribution of current error due to the small signal output conductance $g_O$ of the reference current source and the cancellation thereof will be explained in more detail below. For the purpose of the present discussion, the error current is given as:

$$I\epsilon = I_{T\_P} - I_{REF}.$$

As described above, the goal of the calibration is to make current $I_{T\_P}$ equal to reference current $I_{REF}$. If the two currents are equal, the error current $I\epsilon$, being the difference of current $I_{T\_P}$ and $I_{REF}$, is zero and no correction to the biasing voltage of memory device $M_{M\_P}$ is required. However, if the current source of spare cell 118 is out of calibration, an error current $I\epsilon$ will result and the error current appears at the input terminal of transresistance amplifier 120. The error current appearing at the input terminal (node IN) of transresistance amplifier 120 will drive the transresistance amplifier to cause the amplifier to vary its output voltage value $V_O$ as follows:

$$V_O = V_{ODC} + v_O, \text{ and}$$

$$v_O = R * I\epsilon,$$

where voltage $V_{ODC}$ is the nominal bias voltage to be applied to the gate terminal of the memory device $M_{M\_P}$ and voltage $v_O$ represents a voltage variation added to the nominal bias voltage value to correct for the error current.

Thus, when there is an error current $I\epsilon$ at the IN node, transresistance amplifier 120 will vary its output voltage $V_O$ in proportion to the error current. The output voltage $V_O$ of the transresistance amplifier at node OUT drives the gate terminal of memory device $M_{M\_P}$ through switch $S_{3\_P}$. The output voltage $V_O$ in turn changes the gate-to-source voltage of the memory device to adjust contribution of drain current by the memory device to source current $I_{T\_P}$. The negative feedback introduced by the calibration feedback loop vary the gate-to-source voltage of the memory device to regulate current $I_{T\_P}$ so as to reduce the error current to zero. That is, the variation $v_O$ applied to output voltage $V_O$, results in a variation of the gate-to-source voltage of the memory device $M_{M\_P}$ which operates to force current $I_{T\_P}$ to equal to reference current $I_{REF}$.

When calibration is completed, the entire stack of transistor devices, including the current generating devices $M_{CS\_P}$ and $M_{M\_P}$ and the output device $M_{C\_P}$, is calibrated. The calibration feedback loop forces the error current at the IN node to zero and therefore setting source current $I_{T\_P} = I_{REF}$.

After calibration of spare cell 118 is completed, calibration of current source cell 110 can be carried out by opening of switches $S_{1\_P}$ and $S_{3\_P}$ and closing of switches $S_1$ and $S_3$. The calibration circuit is therefore coupled to current source cell 110. Furthermore, switch $S_2$ is open to disengage current source cell 110 from driving current steering switches $M_{S1}$ and $M_{S2}$ while switch $S_{2\_P}$ is closed to allow spare cell 118 to substitute current source cell 110 while current source cell 110 is being calibrated. The coupling of control signals Q and Q\ of current source cell 110 to drive current steering switches $M_{S1\_P}$ and $M_{S2\_P}$ can be carried out in various ways known to one skilled in the art.

When the calibration circuit including transresistance amplifier 120 and reference current source 122 are coupled to the gate terminal of memory device $M_M$ and current output node 15, calibration of the current source (transistors $M_M$ and $M_{CS}$) and cascode device $M_C$ is carried out to force current $I_T$ at node 12 to equal to reference current $I_{REF}$. Thus, any error current $I\epsilon = I_T - I_{REF}$ appearing at the input terminal (node IN) of transresistance amplifier) is forced to zero by the negative feedback operation of the calibration feedback loop.

When calibration of current source cell 110 is completed, switches $S_1$ and $S_3$ are open and switch $S_2$ is closed to put current source cell 110 back in active mode for normal operation. When current source array 100 includes other current source cells, calibration of the other current source cells can proceed in the same manner as described above.

The current source array calibration scheme of the present invention provides many advantages over conventional calibration schemes. First, the compound structure of the current source including the output device has a much smaller output conductance, measured at the drain terminal of the cascode device $M_C$, than the output conductance at the current source (transistors $M_{CS}/M_M$) alone. Thus, by applying calibration to the entire compound structure, the source current $I_T$ thus calibrated is less sensitive to pre-calibration/post-calibration voltage differences at the current output node 15 and the common drain node 12. The calibration is thus more accurate than that can be achieved using conventional techniques.

Second, mismatches in the cascode devices $M_C$ and $M_{C\_P}$ of the current source array are now accounted for and calibrated out by the calibration scheme in accordance with the present invention. The accuracy of the calibration is therefore further enhanced.

Third, the use of transresistance amplifier 120 in the calibration circuit of the present invention provides many advantages. The transresistance amplifier 120 introduces a necessary level shift between the voltage $V_O$ at the gate terminal of memory device $M_M$ and the voltage at the current output node $V_C$ (node 15) of the cascode device $M_C$. The level shift function ensures that voltage $V_O$ is always higher than voltage $V_C$ to allow for maximum design freedom for the compound current source circuit. The level shift function is a particularly useful feature when low power supply voltages Vdd are used.

Furthermore, the feedback action introduced by transresistance amplifier 120 has the effect of increasing the load conductance as seen by reference current source 122 during calibration so that calibration error due to the current drawn by the small signal output conductance $g_O$ of the reference current source is further reduced. As described above, reference current source 122 has an output impedance represented as small signal output conductance $g_O$ which results in a small amount of current being drawn through the conductance $g_O$ and thereby introducing error in the calibration. When the conventional calibration scheme is used, memory device $M_M$ is diode-connected during calibration and reference current $I_{REF}$ is drawn to the gate and drain terminals of memory device $M_M$ to program the gate voltage. As thus configured, the small signal transconductance of the diode connected transistor $M_M$ would be about equal to the small signal output conductance of the reference current source, that is, $g_O \approx g_m$. When the reference current source sees a load impedance that is about the same as its own output impedance, the output current provided by the current source will include an additional current component drawn by the current source's own output impedance. The finite ratio $g_m/g_O$ therefore introduces an additional calibration error due to the current "lost" into conductance $g_O$ of the reference current source. Specifically, the output current from reference current source 122 is not exactly reference current $I_{REF}$ but the reference current plus the current drawn by the small signal output conductance $g_O$.

However, in the calibration feedback loop of the present invention, due to the magnification effect of transresistance amplifier 120, the load impedance as seen by the reference current source is not just the transconductance $1/g_m$ of the memory device but the transconductance magnified by the transresistance amplifier 120. Specifically, reference current source 122 will see a small signal load impedance given as:

$$g_L = g_m \cdot (g_i \cdot R),$$

where $g_i$ is the small signal input conductance of the transresistance amplifier. The product $g_i \cdot R$, which is the loop gain of the feedback loop, can be significant, such as greater than 30. Consequently, the finite conductance ratio $g_L/g_O$ as seen by the reference current source 122 is significantly magnified. When the load impedance of the reference current source is much larger than its own output impedance, the current drawn due to the output impedance (small signal output conductance $g_O$) is reduced significantly so that less current is lost in the small signal output conductance $g_O$ of the reference current source. In this manner, the calibration scheme of the present invention significantly reduces the additional source of error due to the small signal output conductance $g_O$ of the reference current source and the overall accuracy of the calibration is improved.

Figure 5:
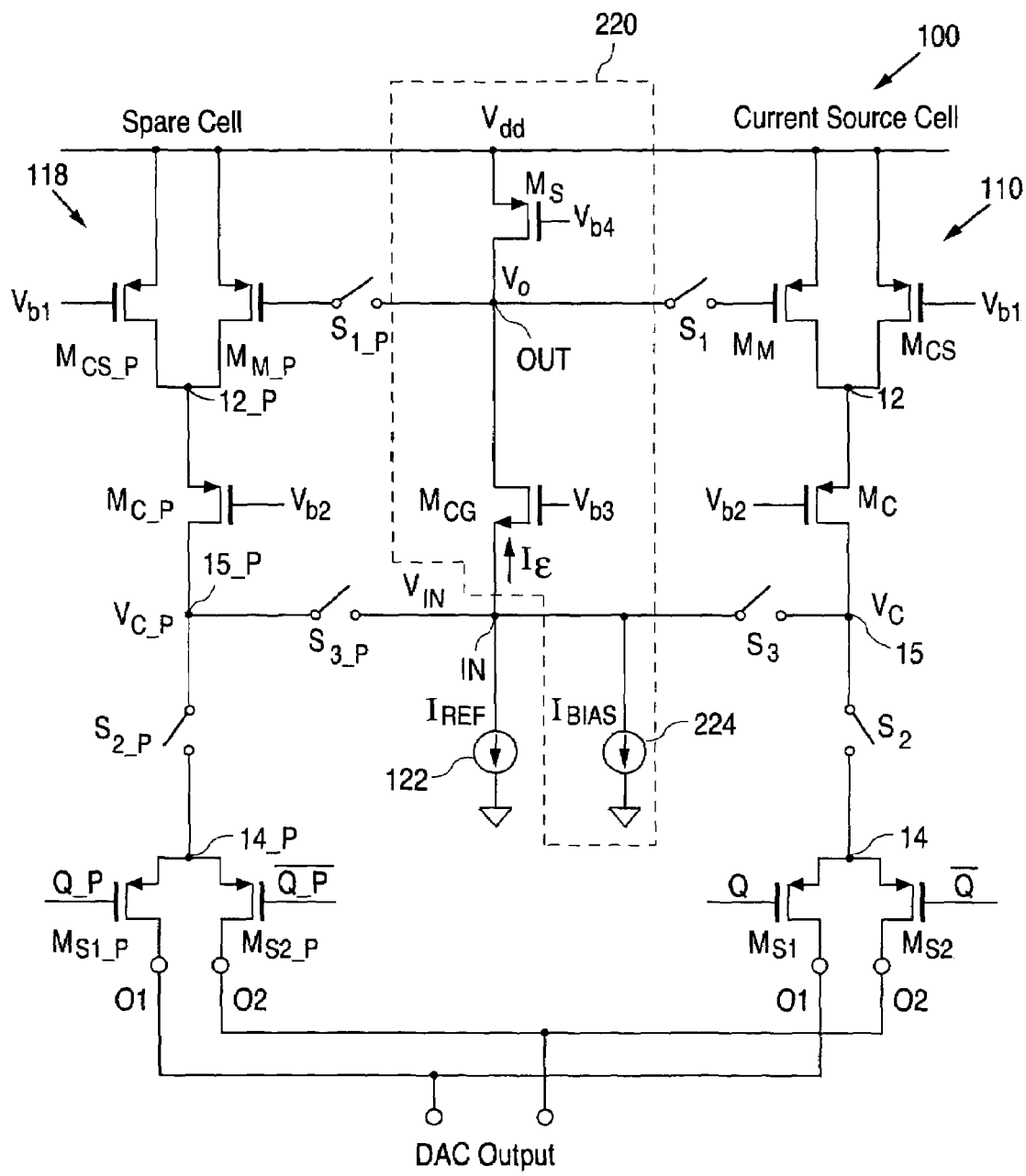
FIG. 5 illustrates a circuit implementation of a transresistance amplifier in the current source array of FIG. 3 according to one embodiment of the present invention.

FIG. 5 illustrates a circuit implementation of a transresistance amplifier in the current source array of FIG. 3 according to one embodiment of the present invention. Like elements in FIGS. 3 and 5 are given like reference numerals to simplify the discussion. Referring to FIG. 5, a transresistance amplifier 220 for receiving the input error current Iε at node IN and providing an output voltage $V_O$ at node OUT is implemented as a common gate amplifier. Specifically, transresistance amplifier 220 includes a bias current source 224 providing a bias current $I_{BIAS}$, a PMOS transistor $M_S$ biased by a DC voltage $V_{b4}$ and an NMOS transistor $M_{CG}$ biased by a DC voltage $V_{b3}$. Transistor $M_S$ and transistor $M_{CG}$ are connected in series between the $V_{dd}$ voltage and the input terminal (node IN) of the transresistance amplifier. The common node between the drain terminal of transistor $M_S$ and the drain terminal of transistor $M_{CG}$ is the output terminal of transresistance amplifier 220 where the output voltage $V_O$ is generated. Bias current source 224 is coupled to the input terminal (node IN) of the transresistance amplifier.

In operation, transistor $M_S$ is biased in a manner so as to provide a drain current equal to bias current $I_{BIAS}$. A nominal bias voltage $V_{ODC}$ is thus developed as the output voltage $V_o$ at the output node OUT in the absence of any input error current. Bias current $I_{BIAS}$ is also forced through transistor $M_{CG}$. Transistor $M_{CG}$, biased by gate voltage $V_{b3}$ and having bias current $I_{BIAS}$ forced through its drain and source terminals, sets the source voltage at the input node IN which is the input voltage $V_{IN}$ of transresistance amplifier 220.

At the input terminal (node IN), transresistance amplifier 220 receives an input current (error current Iε) that flows through transistor $M_{CG}$. Transistor $M_{CG}$, having to carry a current equaling bias current $I_{BIAS}$ and error current Iε, varies it drain voltage in accordance with the current being forced through the source terminal. An output voltage $V_O$ indicative of the input error current Iε and the bias current $I_{BIAS}$ thus develops at the output terminal (node OUT). In transresistance amplifier 220, the gain of the amplifier is given as: $R = 1/(g_{dsMS} + g_{ds}M_{CG})$ and the input impedance is given as: $g_i = g_{m(MCG)}$. That is, the input impedance of transresistance amplifier 220 is the transconductance of transistor $M_{CG}$. As described above, because of the magnified input impedance $g_L$ of the transresistance amplifier, the calibration accuracy limitation due to the finite impedance ratio $g_L/g_O$ is significantly reduced.

Transresistance amplifier 220 of FIG. 5 can be applied in the calibration circuit of the present invention to form the calibration feedback loop for calibrating a current source array.

Alternate Embodiments

As discussed above, the current source array 100 of FIGS. 3 and 5 including a single current source cell and a single spare cell is illustrative only. In other embodiments, the current source array may include multiple current source cells and one or more spare current source cells where the spare current source cells have the same structure as the current source cells. Each current source cell and each spare current source cell can be periodically calibrated using the calibration scheme of the present invention by coupling the calibration circuit to each current source cell through the respective switches $S_1$ and $S_3$.

In the embodiments shown in FIGS. 3 and 5, a switch $S_2$ is included in the output source current path of each source current cell (and switch $S_{2\_P}$ for the spare cell). Switch $S_2$ in each of the current source cell is used to isolate the current output node (node 15) from the current steering switches when the current source cell is being calibrated. Switch $S_2$ is an optional component of the current source cell and is not necessary to the practice of the calibration scheme of the present invention. Switch $S_2$ may be omitted when the current source cell is constructed using certain control schemes currently known or to be developed.

A method and an apparatus for calibrating a current source array using a fully configured spare current source cell is described in copending and commonly assigned U.S. patent application Ser. No. 11/086,901, entitled "Calibration of a Current Source Array," filed Mar. 21, 2005, of the same inventor hereof, which application is incorporated herein by reference in its entirety. In one embodiment, the current source array of FIGS. 3 and 5 implements the control scheme described in the aforementioned '901 application where an output overrideable latch circuit is coupled to control the current steering switches of each current source cell and each spare cell and a state bus is used to carry the digital signals to each latch circuit. When the control scheme of the '901 application is applied in the current source array of FIGS. 3 and 5, switch $S_2$ in each current source cell and switch $S_{2\_P}$ in the spare cell can be omitted. Instead, the current output node 15 can be connected directly to the common source node (node 14) of the current steering switches.

In other embodiments of the present invention, the bias voltage $V_{b2}$ for cascode transistor $M_C$ or $M_{C\_P}$ of each current source cell or spare cell can be a fixed DC voltage or a regulated voltage. When voltage $V_{b2}$ is a regulated voltage, known impedance boosting schemes can be used to regulate voltage $V_{b2}$ in order to magnify the output impedance looking into the drain terminal of the cascode transistor $M_C$. In this manner, the output impedance of the entire current source cell is further magnified.

Transresistance Amplifier

In the above described embodiments, a traditional common gate amplifier is used to implement the transresistance amplifier of the calibration circuit. Other conventional transresistance amplifier circuit can also be used to implement the transresistance amplifier in the calibration circuit of the present invention. However, the conventional transresistance amplifiers have many limitations and disadvantages when applied in the calibration circuit of the present invention.

First, as discussed above, one of the sources of error limiting the calibration accuracy is represented by the term $V_{IN}g_O$ which is an error current drawn by the output conductance of the reference current source. If the contribution by this error current is not negligible as previously assumed, then the actual current drawn out of the IN node by reference current source is a current $I_{REF}+V_{IN}*g_O$. When the calibration feedback loop of the present invention operates to nullify the error current I$\epsilon$, the calibrated source current $I_T$ (or $I_{T\_P}$ for the spare cell) will be forced to equal to current $I_{REF}+V_{IN}*g_O$, instead of the intended reference current $I_{REF}$. In order to eliminate calibration inaccuracy due to the output conductance of the reference current source, the error current contribution given by $V_{IN}g_O$ needs to be made negligible. This can be accomplished by designing the reference current source so that the output conductance is sufficiently small. Alternately, the error current contribution can be made negligible by magnifying the load conductance as seen by the reference current source so that the finite impedance ratio $g_L/g_O$ is large, as discussed above.

However, in most practical cases, the aim of the current source calibration is to calibrate all current source cells so that mismatches between the current source cells' individual total output current $I_T$ are made negligible. Thus, another way to accomplish accurate calibration is to make the source currents $I_T$ of all current source cells in the array matches one another even though the individual source currents $I_T$ differ from the intended calibration value defined by reference current $I_{REF}$. In other words, as long as the source currents $I_T$ of all the current source cells differ by the same amount from the reference current $I_{REF}$, the source currents $I_T$ of all current source cells in the array will match one another and calibration accuracy is ensured. Therefore, to accomplish accurate calibration, it is sufficient to insure that the current value $I_{REF}+V_{IN}*g_O$ at the reference current source is always the same value for all calibrated current source cells. Accordingly, it is only necessary to make the current contribution $V_{IN}g_O$ the same for all calibrated current source cells at the end of the calibration process to ensure calibration accuracy.

Another source of calibration error is due to a change in the drain voltage of the cascode device between the time the current source cell including the cascode device is being calibrated and the time when the calibrated current source cell is put in normal operation. Referring again to FIG. 5, assume that current source cell 110 is being calibrated (switch $S_3$ is closed), the source current $I_T$ at node (12) is modulated by the calibration circuit to match reference current $I_{REF}$. At this time, the drain voltage $V_C$ (node 15) of cascode transistor $M_C$ is set by the source voltage of transistor $M_{CG}$ of transresistance amplifier 220 which is denoted as the input voltage $V_{IN}$ at node IN. Thus, during calibration, $V_C=V_{IN}$. In transresistance amplifier 220, the input voltage $V_{IN}$ is forced to be:

$$V_{IN}=V_{b3}-V_{gsCG}, \quad (1)$$

where $V_{gsCG}$ is the gate-to-source voltage of transistor $M_{CG}$. Voltage $V_{gsCG}$ has a value determined by its drain current $I_{dCG}$, which in turn is forced to be equal to bias current $I_{BIAS}$ by both transistor $M_S$ and the bias current source 224.

However, following calibration, current source cell 110 is put back to normal operation by opening switch $S_3$ and closing $S_2$. When current source cell 110, once calibrated, is put back in normal operation, the drain voltage $V_C$ (node 15) of cascode transistor $M_C$ is now determined by the current steering switches $M_{S1}$ and $M_{S2}$. Specifically, in actual operation, only one of the current steering switches $M_{S1}$ and $M_{S2}$ will be turned on at a time. The one current steering switch that is turned on will set the drain voltage $V_C$ (node 15) of cascode transistor $M_C$ to:

$$V_C=V_{LO}+V_{SG}, \quad (2)$$

where voltage $V_{LO}$ is the gate potential applied to turn on the respective MOS current steering switch and voltage $V_{SG}$ is the source-to-gate voltage of the same MOS current steering switch.

In almost all cases, the drain voltage $V_C$ in normal operation (given by equation (2)) is not the same of the input voltage $V_{IN}$ (given by equation (1)) during calibration. When these two voltages are not the same, due to the finite output impedance of the current source cell measured at the drain terminal of transistor $M_C$, the source current $I_T$ when the current source cell is being used in normal operation will be different from the calibrated value. Hence, the effectiveness of the calibration process is weakened because the current source cell has not been calibrated in a condition close enough to its normal operating condition.

According to another aspect of the present invention, a transresistance amplifier generates an output voltage indicative of an input current while imposing a predetermined input voltage at the input terminal of the transresistance amplifier. The predetermined input voltage can be selected to match or to track a desired voltage value so that when the transresistance amplifier is coupled to a circuit in application, the transresistance amplifier duplicates or preserves the desired operating conditions of the circuit.

In one application, the transresistance amplifier of the present invention is used to form the calibration circuit to implement the calibration scheme for a current source array of the present invention as described above. The transresistance amplifier can operate to provide an output voltage that varies in accordance with an input error current while imposing an input voltage value at the input terminal that tracks the drain voltage ($V_C$) of the output device of the current source cell under normal operating conditions (i.e., not being calibrated). That is, the transresistance amplifier can be configured to impose an input voltage at its input terminal having a value equal to voltage $V_C$ defined by equation (2) above. In this manner, when the transresistance amplifier together with the reference current source are coupled to calibrate a current source cell, the input voltage imposed by the transresistance amplifier ensures that the output device of the current source cell is calibrated under a condition that matches it's actual operating condition. Calibration accuracy is thus not lost when the current source cell is put back in normal operation after calibration is completed.

Note that, if in the circuit of FIG. 3, the quiescent voltage $V_{IN}$ of the input node IN is forced by the biasing circuit to be equal to $V_C$ of $M_C$ as in (3), then all of the above discussed limitations will be resolved. Indeed, in this latter condition, the term $V_{IN}g_O$ will always be the same because $V_{IN}$ is constant and is imposed by the amplifier biasing, which is used to calibrate all cells in the array.

Another advantage of using the transresistance amplifier of the present invention to form the calibration circuit in accordance with the present invention is that mismatches due to the output conductance of the reference current source can be eliminated entirely. Specifically, by using the transresistance amplifier to impose a specific input voltage $V_{IN}$ at the input node IN, the error current contribution $V_{IN}g_O$ will guarantee to be the same for all current source cells calibrated using the same transresistance amplifier. Therefore, even if the error current contribution from the output conductance $g_O$ of the reference current source cannot be reduced to zero, the error current contribution can be made the same for all the calibrated current source cells, thereby achieving the goal of realizing a highly accurate calibration result.

Figure 6:
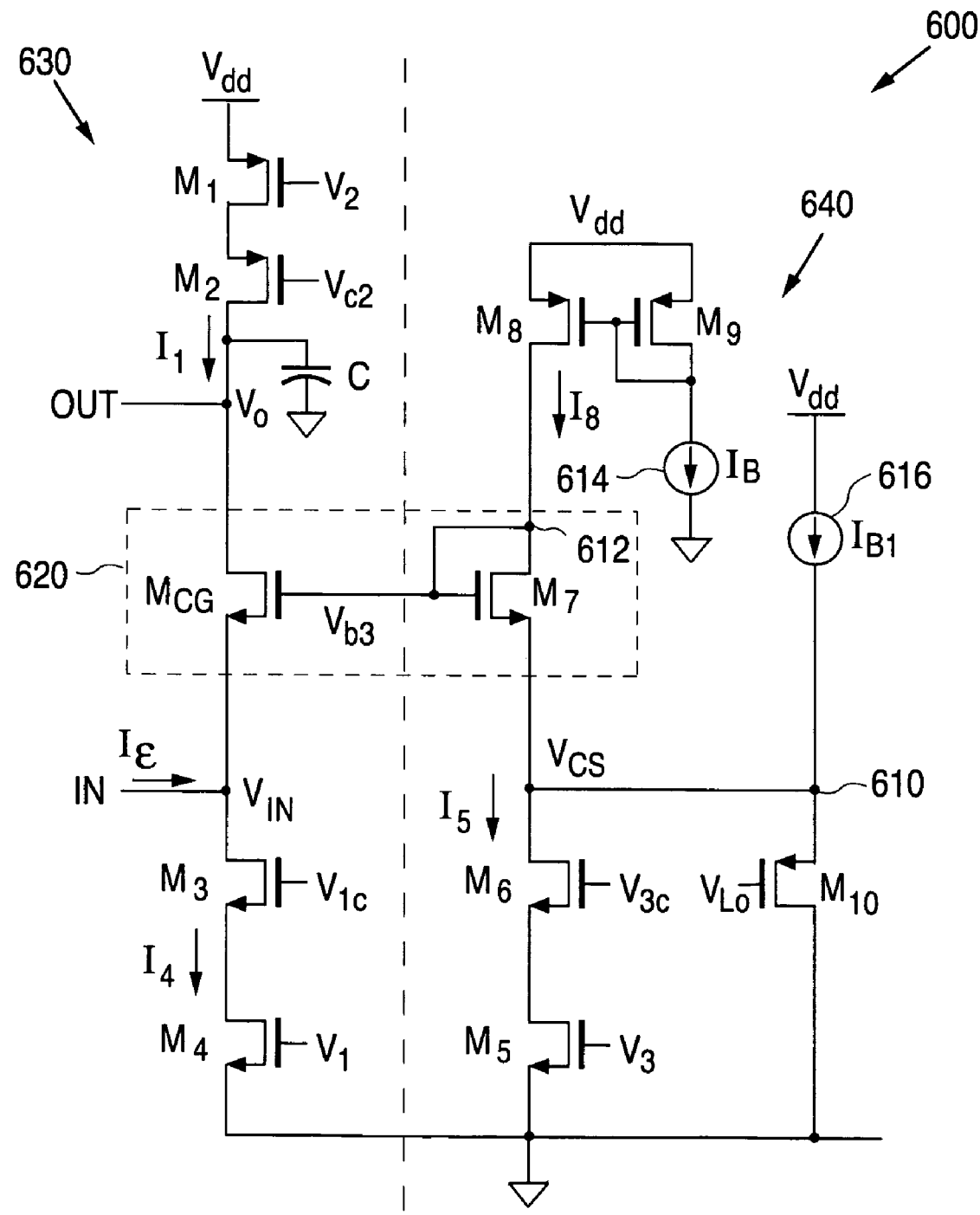
FIG. 6 is a circuit diagram of a transresistance amplifier according to one embodiment of the present invention.

FIG. 6 is a circuit diagram of a transresistance amplifier according to one embodiment of the present invention. Referring to FIG. 6, transresistance amplifier 600 includes a common-gate amplifier circuit 630 that is implemented using a traditional common-gate amplifier architecture and a biasing circuit 640 for imposing a predetermined input voltage at the input terminal IN of the transresistance amplifier. Specifically, transistors $M_1$, $M_2$, $M_3$, $M_4$, and $M_{CG}$ to the left of the dotted line form the common-gate amplifier 630 while transistors $M_5$, $M_6$, $M_7$, $M_8$, $M_9$ and $M_{10}$ and current sources 614 ($I_B$) and 616 ($I_{B1}$) to the right of the dotted line form the biasing circuit 640. Biasing circuit 640 operates to set the bias voltage $V_{b3}$ driving the gate terminal of transistor $M_{CG}$ of the common-gate amplifier 630. Transresistance amplifier 600 receives an input current (denoted current I∈) at the input terminal IN and provides an output voltage $V_{OUT}$ at an output terminal OUT indicative of the input current value.

In common-gate amplifier 630, PMOS transistors $M_1$ and $M_2$, biased by bias voltages $V_2$ and $V_{C2}$ respectively, are connected in series between the power supply Vdd voltage and the output node OUT of transresistance amplifier 600. The serial connection of transistors $M_1$ and $M_2$ implements the same function as transistor $M_S$ of the transresistance amplifier of FIG. 5. By using two serially connected transistors in place of a single transistor, a very high output impedance at the output terminal OUT can be obtained. However, in other embodiments, when a high output impedance is not critical, transistors $M_1$ and $M_2$ can be replaced by a single PMOS transistor.

NMOS transistors $M_3$ and $M_4$, biased by bias voltages $V_{1c}$ and $V_1$ respectively, implement a bias current source providing a current $I_4$ having a current value $I_{BIAS}$. Transistors $M_3$ and $M_4$ are connected in series between the input terminal IN and the ground potential. NMOS transistor $M_{CG}$ has a source terminal connected to the input terminal IN, a drain terminal connected to the output terminal OUT and a gate terminal biased by the bias voltage $V_{b3}$ generated by biasing circuit 640. As thus configured, current $I_4$ is forced out of the source terminal of transistor $M_{CG}$, causing the same current (current $I_1$) to flow in the drain terminal of transistor $M_{CG}$. Thus, $I_4=I_1=I_{BIAS}$. As thus biased, a nominal output voltage $V_{ODC}$ is generated at the output terminal OUT.

Having established the common-gate amplifier circuit 630, the biasing circuit 640 applied to drive the common-gate transistor $M_{CG}$ will now be described. For the purpose of the present discussion, it is assumed that transresistance amplifier 600 is to be applied in the calibration circuit of the present invention as described above and thus the predetermined voltage to be imposed on the input terminal IN is the drain voltage $V_C$ of the output device of the current source cell, as given by equation (2) above. When transceiver amplifier 600 is used to form the calibration circuit of FIG. 3 and voltage $V_{IN}$ is forced to equal to voltage $V_C$ of transistor $M_C$ as in equation (2) above, the calibration of a current source cell will be performed by forcing transistor $M_C$ to be in the same operating conditions as when the current source cell is utilized in normal operation to provide the DAC output. Thus, calibration accuracy is maintained when the calibration current source cell is put back in normal operation after calibration.

In biasing circuit 640, the desired voltage to be imposed on input terminal IN is duplicated as voltage $V_{CS}$ at node 610. In the present discussion, because the desired voltage to be matched or tracked is the drain voltage $V_C$ of a current source cell, biasing circuit 640 includes a PMOS transistor $M_{10}$ for duplicating the MOS current steering switches $M_{S1}$, $M_{S2}$. The voltage $V_{LO}$, which is the turn-on voltage of the current steering switches, is applied to the gate terminal of transistor $M_{10}$. Transistor M10 receives a drain current $I_{B1}$ which is selected to equal to the source current $I_T$ provided by a current source cell. By duplicating the circuit construction for generating the desired voltage, a voltage $V_{CS}$ is developed at node 610 which will match and track the desired voltage $V_C$ to be imposed at the input terminal IN. Specifically, when current $I_{B1}=I_T$ flows into transistor $M_{10}$, the source potential $V_{CS}$ of transistor $M_{10}$ is given by:

$$V_{CS}=V_{LO}+V_{SG10}, \quad (3)$$

where $V_{SG10}$ is the source-to-gate voltage of transistor $M_{10}$ and $V_{LO}$ is the turn-on voltage of the current steering switches. Because transistor $M_{10}$ matches a turned-on current steering switch (either switch $M_{S1}$ or $M_{S2}$) in a current source cell, voltage $V_{CS}$ in equation (3) above will be equal to voltage $V_C$ in equation (2) above which is the drain voltage of transistor $M_C$ during normal current source cell operation.

In sum, transistor $M_{10}$ and bias current $I_{B1}$ (current source 616) are used to generate voltage $V_{CS}$ which is a duplicate version of the desired voltage to be matched. In other embodiments, other circuit structure can be used to generate voltage $V_{CS}$ as the desired voltage to be matched. Transistor $M_{10}$ and bias current $I_{B1}$ in the present embodiment of transresistance amplifier 600 is illustrative only.

Biasing circuit 640 further includes NMOS transistors $M_5$ and $M_6$ connected in series between the $V_{CS}$ voltage (node 610) and the ground potential. NMOS transistors $M_5$ and $M_6$, biased by bias voltages $V_{3C}$ and $V_3$ respectively, implement a second bias current source providing a current $I_5$ having a current value $I_{BIAS}$. Biasing circuit 640 also includes PMOS transistors $M_8$ and $M_9$ forming a current mirror. A current source 614 provides a current $I_B$ at the drain terminal of transistor $M_9$ which is mirrored in the drain terminal of transistor $M_8$ as current $I_8$. A diode connected NMOS transistor $M_7$ has a drain terminal coupled to transistor $M_8$ to receive current $I_8$ and a source terminal coupled to the $V_{CS}$ voltage (node 610). The source voltage at transistor $M_7$ is thus voltage $V_{CS}$ which is the desired voltage to be matched or tracked. As thus configured, current $I_8$ flows through transistor $M_7$ and current $I_5=I_8=I_{BIAS}$. In one embodiment, transistors $M_8$ and $M_9$ are of equal size and current $I_B$ provided by current source 614 is equal to current $I_8$. Therefore, current $I_5=I_8=I_B=I_{BIAS}$.

In transresistance amplifier 600, transistor $M_7$ matches transistor $M_{CG}$ and is coupled to form a current mirror with transistor $M_{CG}$. Thus, the gate terminal (node 612) of diode-connected transistor $M_7$ is connected to the gate terminal of transistor $M_{CG}$. As thus configured, a bias voltage $V_{b3}$ is developed at the gate terminals of transistors $M_7$ and $M_{CG}$. Because the same current $I_{BIAS}$ is forced through transistor $M_7$ and transistor $M_{CG}$, the two transistors will be biased with the same gate-to-source voltages. The voltage $V_{b3}$ is thus given as:

$$V_{b3} = V_{CS} + V_{GS7} \quad (4)$$

where voltage $V_{GS7}$ is the gate-to-source voltage of transistor $M_7$ when current $I_8$ having a current value of $I_{BIAS}$ flows into its drain. Because the gate-to-source voltages of transistors $M_7$ and $M_{CG}$ are the same, the input voltage at the input terminal IN can thus be given as:

$$V_{IN} = V_{b3} - V_{gsCG} = V_{b3} - V_{GS7} = V_{CS} = V_{LO} + V_{SG10} = V_C \quad (5)$$

where voltage $V_{gsCG}$ is the gate-to-source voltage of transistor $M_{CG}$.

In other words, by developing a source voltage having the desired voltage value at transistor $M_7$ and by forming a current mirror with the common-gate transistor $M_{CG}$ using transistor $M_7$ and by forcing the two transistors of the current mirror to the same gate-to-source voltage, the desired voltage value is thus imposed at the source terminal of the common-gate transistor $M_{CG}$. In this manner, the desired voltage value is imposed at the input terminal IN of transresistance amplifier 600.

By use of biasing circuit 640 in transresistance amplifier 600, the voltage $V_{IN}$ at the input terminal of the amplifier will track the desired voltage $V_{CS}$ developed at the biasing circuit. When the transresistance amplifier 600 is applied in the calibration circuit of FIG. 3 for calibrating a current source cell, the voltage $V_{IN}$ can be made to track a voltage $V_C$ being the voltage at the drain terminal of cascode device $M_C$ of the current source cell when the current source cell is in normal operation. The calibration accuracy can be greatly increased when input voltage $V_{IN}$ is made to track voltage $V_c$ in normal operation.

A main advantage of the transresistance amplifier of the present invention is that the biasing circuit is configured in a manner so as to allow the voltage $V_{CS}$ to track changes in the desired voltage to be matched. For example, when the current source array of FIG. 3 is used to implement a digital-to-analog converter, the source current $I_T$ is usually user programmable and can be varied over a wide range of values to allow for different DAC full scale currents. As source current $I_T$ is varied, the drain voltage $V_C$ of the output device of the current source cell will also vary. Because the transresistance amplifier of the present invention duplicates the generation of the drain voltage $V_C$ in the biasing circuit, the duplicate voltage $V_{CS}$ will track the variations in the desired voltage to be matched (voltage $V_C$) so that voltage $V_{IN}$ will be kept systematically matched to the desired matching voltage (voltage $V_C$) despite variations in voltage $V_C$.

When transresistance amplifier 600 is applied in a feedback loop, stability consideration usually requires a capacitor to be coupled to the feedback loop. In the present embodiment, a capacitor C is coupled to the output terminal OUT of transresistance amplifier to set a dominant pole for the feedback loop. Capacitor C is optional in other embodiments, particularly when the transresistance amplifier is not used in a feedback loop circuit.

In one embodiment, transistor $M_{10}$ is sized to match the current steering transistors on a 1:1 ratio. In other embodiments, biasing circuit 640 can be scaled in order to reduce the silicon area required for implementing the circuit and also to reduce the power dissipation from the biasing circuit. Specifically, proper current scaling of currents $I_8$, $I_5$, and $I_{B1}$ and proper size scaling of transistors $M_8$, $M_9$ and $M_{10}$ can be applied while ensuring that the voltage conditions in equation (5) above is satisfied.

For instance, one of the objectives of biasing circuit 640 is to set current $I_5$ equal to current $I_8$. Therefore, the size ratio of transistors $M_8$ and $M_9$ can change, together with corresponding changes to current $I_B$ supplying transistor $M_9$ to meet the current equality requirement for currents $I_5$ and $I_8$. For example, current $I_B$ can be selected as $2*I_8$ and transistor $M_9$ can be selected as 2 times the size of transistor $M_8$ and current $I_8$ remains equal to current $I_5$.

Another objective of biasing circuit 640 is to ensure that transistor $M_7$ matches transistor $M_{CG}$. Matching of two transistors does not necessarily mean the two transistors have to have the same size. In general, two transistors are matched when they are designed using special layout techniques, such as interdigitation and common centroid methods, to ensure that both transistors experience the same amount of deviations due to manufacturing process variations or operating condition variations. Therefore, two transistors can be matched while having difference device sizes as long as the two transistors experience the same relative differences due to the manufacturing process and operating conditions. Thus, in one embodiment, currents $I_8$ and $I_5$ is scaled to $I_{BIAS}/4$ and the width of transistor $M_7$ is scaled to ¼ of the width of transistor $M_{CG}$. As long as transistor $M_7$ matches transistor $M_{CG}$, the same gate-to-source voltage will develop across transistor $M_7$ and across transistor $M_{CG}$.

Another objective of biasing circuit 640 is to replicate the desired voltage to be matched. In the case where the desired voltage to be match is the drain voltage $V_C$ of a current source cell, transistor $M_{10}$ and current $I_{B1}$ must replicate, in part or in full, the source current $I_T$ and the current steering switches $M_{S1}$ or $M_{S2}$ receiving the source current. Thus, transistor $M_{10}$ can be scaled along with current $I_{B1}$ as long as the combination generates the same voltage $V_{CS}$ at node 610. For example, current $I_{B1}$ can be set to $1/2*I_T$ while the width of transistor $M_{10}$ is set to one-half of the width of the current steering switches $M_{S1}$ or $M_{S2}$. Alternately, current $I_{B1}$ can be set to $2*I_T$ while the width of transistor $M_{10}$ is set to twice that of the current steering switches $M_{S1}$ or $M_{S2}$. When the currents and transistor sizes are scaled to reduce the transistor widths and the current levels, lower overall current consumption can be realized.

The circuit diagram of FIG. 6 illustrates the implementation of transresistance amplifier 600 according to one embodiment of the present invention where N-channel MOS transistors are used to implement the common gate transistor $M_{CG}$ and $M_7$. One of ordinary skill in the art, upon being apprised of the present invention, would appreciate that the transresistance amplifier of the present invention can be constructed using transistors of complementary polarities. For example, a PMOS transistor can be used to form transistor $M_{CG}$ with the corresponding changes in transistor and voltage/current polarities for the amplifier circuit and the biasing circuit. A PMOS transistor $M_{CG}$ is useful when the transresistance amplifier is to be coupled for use with NMOS-based current source cells.

The above detailed descriptions are provided to illustrate specific embodiments of the present invention and are not intended to be limiting. Numerous modifications and variations within the scope of the present invention are possible. For example, the current source in the current source cell providing the source current can be implemented using a variety of current source circuits and a variety of output devices. The current source for use in the current source cell only needs to be one that can be calibrated to provide a substantially constant output current. The output device for the current source can be an NMOS transistor or an N-type or P-type bipolar transistor. The present invention is defined by the appended claims.

I claim:

1. A transresistance amplifier circuit, comprising:
   an input terminal receiving an input current;
   an output terminal providing an output voltage indicative of the input current;
   a first bias current source providing a first bias current to the input terminal;
   a first transistor having a first current handling terminal coupled to the output terminal, a second current handling terminal coupled to the input terminal, and a control terminal receiving a first bias voltage;
   a second transistor having a first current handling terminal coupled to a first supply voltage, a second current handling terminal coupled to the output terminal, and a control terminal receiving a second bias voltage; and
   a biasing circuit for generating the first bias voltage for the first transistor, the first bias voltage being generated to drive the first transistor for imposing a first voltage at the input terminal,
   wherein the first voltage is equivalent to a selected voltage of an application circuit to which the transresistance amplifier is to be coupled and the biasing circuit generates the first bias voltage in a manner so as to allow the first voltage to track variations in the selected voltage.

2. The transresistance amplifier circuit of claim 1, wherein the output voltage generated at the output terminal in response to the input current comprises a base voltage value set by the bias current and a voltage variation about the base voltage value, the voltage variation being indicative of the input current.

3. The transresistance amplifier circuit of claim 1, wherein the biasing circuit comprises:
   a voltage generation circuit for generating the first voltage at a first node, the first voltage being generated to track variations in the selected voltage in the application circuit;
   a third transistor having a first current handling terminal coupled to the first node to be biased by the first voltage, a second current handling terminal and a control terminal connected together and coupled to receive a second bias current, the control terminal providing the first bias voltage;
   a second bias current source supplying the second bias current to the second current handling terminal and the control terminal of the third transistor; and
   a third bias current source providing a third bias current to the first current handling terminal of the third transistor, the third bias current being equal to the second bias current and also being proportional to the first bias current,
   wherein the third transistor matches the first transistors and the third transistor and the first transistor form a current mirror, the first bias voltage at the control terminal of the third transistor is coupled to the control terminal of the first transistor to impose the first voltage at the input terminal of the transresistance amplifier.

4. The transresistance amplifier circuit of claim 1, wherein the second transistor of the transresistance amplifier comprises a fourth transistor and a fifth transistor connected in series between the first supply voltage and the output terminal, the fourth and fifth transistors being biased by respective bias voltages.

5. The transresistance amplifier circuit of claim 1, wherein the first bias current source comprises
   a sixth transistor and a seventh transistor connected in series between the input terminal and a second supply voltage, the sixth and seventh transistors being biased by respective bias voltages to generate the first bias current.

6. The transresistance amplifier circuit of claim 3, wherein the second bias current source comprises a current mirror receiving a fourth bias current on a first current handling terminal and providing the second bias current at a second current handling terminal, the current mirror comprising an eighth transistor and a ninth diode-connected transistor.

7. The transresistance amplifier circuit of claim 6, wherein the fourth bias current is N times the second bias current and the ninth diode-connected transistor has a size N times the size of the eighth transistor, N being greater than or equal to one.

8. The transresistance amplifier circuit of claim 3, wherein the third bias current source comprises a tenth transistor and an eleventh transistor connected in series between the first node and a second supply voltage, the tenth and eleventh transistors being biased by respective bias voltages to generate the third bias current.

9. The transresistance amplifier circuit of claim 3, wherein the selected voltage comprises a voltage a current output node of a current source cell and the voltage generation circuit of the biasing circuit comprises:
   a first switch being a duplicate switch of and having a size proportional to either one of the current steering switches of the current source cell, the first switch being coupled between the first node and a second supply voltage and having a control terminal driven by a voltage for closing the current steering switches; and
   a fifth bias current source providing a fifth bias current to the first node, the fifth bias current being proportional to a current at the current output node of the current source cell,
   wherein the first voltage is developed at the first node as a result of the fifth bias current being supplied to the first switch which is closed.

10. The transresistance amplifier circuit of claim 3, wherein the first, second, and third transistors comprise MOS transistors.

11. The transresistance amplifier circuit of claim 3, wherein each of the second and third bias currents is N times the first bias current, N being greater than or less than one, and the third transistor has a size N times the size of the first transistor.

* * * * *